United States Patent
Stubbs et al.

(10) Patent No.: US 6,636,093 B1
(45) Date of Patent: Oct. 21, 2003

(54) COMPENSATION FOR A DELAY LOCKED LOOP

(75) Inventors: Eric T. Stubbs, Boise, ID (US); Christopher K. Morzano, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/616,562

(22) Filed: Jul. 14, 2000

(51) Int. Cl.[7] .................................................. H03L 7/00
(52) U.S. Cl. ....................................... 327/161; 327/277
(58) Field of Search ................................. 327/161, 149, 327/152, 153, 158, 261, 270, 271, 276, 277, 284, 395, 400

(56) References Cited

U.S. PATENT DOCUMENTS

| | | | | |
|---|---|---|---|---|
| 5,815,016 A | * | 9/1998 | Erickson | 327/158 |
| 5,994,934 A | | 11/1999 | Yoshimura et al. | 327/158 |
| 6,100,736 A | * | 8/2000 | Wu et al. | 327/116 |
| 6,285,226 B1 | * | 9/2001 | Nguyen | 327/122 |
| 6,316,976 B1 | | 11/2001 | Miller, Jr. et al. | |

* cited by examiner

Primary Examiner—Timothy P. Callahan
Assistant Examiner—Cassandra Cox
(74) Attorney, Agent, or Firm—TraskBritt

(57) ABSTRACT

A method and apparatus for compensating a delay locked loop against signal timing variances after circuit initialization which cause delay shifts due to temperature and voltage changes and operational noise. A delay line of a delay locked loop is disclosed, the delay line having a plurality of delay elements and a minimum and maximum delay boundary. According to an embodiment of the invention, an artificial minimum or maximum boundary, or both, is established on the delay line such that during initialization of the delay locked loop circuit, the circuit cannot lock on a delay element beyond the artificial minimum or maximum boundaries. By offsetting the artificial minimum and maximum boundaries from the actual minimum and maximum boundaries of the delay line, a buffer of delay elements is established at the actual delay line boundaries. During operation of the delay locked loop apart from initialization, the artificial boundaries become transparent to the delay locked loop and are available for the circuitry to use if needed.

29 Claims, 4 Drawing Sheets

COMPENSATION FOR A DELAY LOCKED LOOP

BACKGROUND OF THE INVENTION

1. Field of the Invention

The present invention relates generally to compensation for the effects of temperature changes, voltage changes and noise on a delay locked loop (DLL). More particularly, the present invention relates to providing a buffer of delay elements at a boundary of an adjustable delay line of a DLL during initialization of the DLL.

2. State of the Art

Many high speed electronic systems possess critical timing requirements which dictate the need to generate a periodic clock wave form having a precise time relationship with respect to a reference signal. The improved performance of integrated circuits (ICs) and the growing trend to include several computing devices or system components on the same board present a challenge with respect to synchronizing the time frames of all of the components.

For optimal performance, the operation of all components in a system should be highly synchronized (e.g., signal skew, or the time difference between the significant edges of the internally generated clocks of all the components, should be minimized). Merely feeding the reference clock of the system to every component is insufficient because different components may have different manufacturing parameters which, when taken together with factors such as ambient temperature, voltage and processing variations, may lead to large differences in the phases of the respective component clock signals.

In conventional ICs, synchronization is achieved by using a delay locked loop (DLL) circuit to detect a phase difference between clock signals of the same frequency and to produce a digital signal related to the phase difference. By feeding back the phase difference-related signal to circuitry controlling a plurality of delay elements in a delay line, the timing of one clock signal, such as a system clock signal, is advanced or delayed until its rising edge is coincident with the rising edge of a second clock signal, such as a component clock signal.

The operation of a conventional digital DLL is shown in FIGS. 1 and 2. In FIG. 1, clock input buffer 2, delay line 4, and data output buffer 8 constitute an internal clock path. Delay line 4 is a variable delay generator with a logic-gate chain. Modeled delay line 6 is coupled to modeled circuits 10, 12 and 14 which emulate the internal clock path components. Modeled circuits include modeled output buffer 10, with modeled load capacitance 14 and modeled clock buffer 12. The modeled components 6, 10, 12 and 14 constitute a modeled clock path having substantially the same delay time as the internal clock path. Shift register 16 is used for activating a number of delay elements in both delay lines 4 and 6 based on a command generated by a phase comparator 18.

The phase comparator 18 compares the modeled clock and the external clock phases which differ by one cycle. This comparison is illustrated in FIG. 2. The external clock signal 20 may be divided down in a divider 22 to produce a divided-down external signal 24. Signal 26 is the signal at the output of modeled delay line 6. Signal 28, which is generated inside phase comparator 18, is a modeled output buffer signal 26 delayed by one delay unit. If both signals 24 and 26 go high before 20 goes low, this means that the output clock is too fast and the phase comparator 18 outputs a shift left (L) command to the shift register 16, as illustrated in FIG. 2. The shift register 16 shifts the tap point of the delay lines 4 and 6 by one step to the left, increasing the delay. Conversely, if both signals 26 and 28 go high after signal 24 goes low, this means that the output clock is too slow and phase comparator 18 outputs a shift right (R) command to the shift register 16. The shift register 16 shifts the tap point of the delay lines 4 and 6 by one step to the right, decreasing the delay. If signal 24 goes low between the time signals 26 and 28 go high, the internal cycle time is properly adjusted and no shift command is generated.

One drawback of conventional DLLs, however, occurs when a DLL is placed in a state of minimum or maximum delay. A state of minimum delay occurs when the delay between the input and output clock signals is as close to zero as allowed by the parameters of the delay line (i.e., when the tap point is at the beginning of the delay line). In this case, if the DLL attempts to decrease the delay, such decrease would be impossible because the delay line is already at a minimum delay. Conversely, maximum delay occurs when the DLL is as close to maximum delay as allowed by the parameters of the delay line (i.e., when the tap point is at the end of the delay line). In the latter case, if the DLL attempts to increase the delay, such increase would be impossible because the delay caused by the delay line is already at the maximum delay permitted. In these minimum and maximum delay states, an attempt to shift beyond the minimum or maximum delay boundary causes the DLL to reset and attempt to relock on another delay state. If this occurs during a "read" operation, the output to the data output circuitry (DQ) may be out of phase with the input clock. When the input and output clocks are out of phase, the signal skew increases and the tAC, or time from when a transition occurs on the system clock to the time when the data comes through DQ, is unstable until the DLL locks again. Increased skew and unstable tAC may result in faulty data transfer and undesired delay.

Temperature and voltage changes, as well as noise generated through operation of an integrated circuit system, may cause a DLL's signal delay setting to shift during operation. If the DLL delay line settings are near the minimum or maximum boundaries of the delay line, these signal timing changes may cause the DLL to shift beyond the minimum and maximum boundaries and result in the DLL attempting to reset while data is being transferred.

One approach to compensating for DLL shifts beyond maximum or minimum boundaries is to construct a wrap-around loop, so that when the DLL is at minimum delay, the delay line shifts around to the maximum delay. This approach, however, involves excess circuitry because DLL delay lines are conventionally of sufficient length to adapt to system changes and noise without exceeding the delay line's boundaries. Furthermore, a wrap-around DLL achieves a phase lock with a signal harmonic rather than the direct signal, which is also less than ideal.

Another approach to compensating for DLL shifts beyond maximum or minimum boundaries is to add a correction latch to a conventional DLL circuit which latches an activation signal upon detection of a state of minimum delay and generates an override shift left (or disabled shift right) signal, causing the delay line to shift towards more delay. The correction latch is then reset once the system itself generates a shift left signal and resumes normal operation. At maximum delay, the reset mechanism resets the shift register to a state of minimum delay. This approach is described in more detail in LIN, FENG, et al., *A Register-*

*Controlled Symmetrical DLL for Double-Data-Rate DRAM*, IEEE Journal of Solid-State Circuits, Vol. 34, No. 4, April 1999, pp. 565–568, the disclosure of which is hereby incorporated herein by reference. This approach, however, also results in undesired delays in adjusting for shifts beyond the delay locked loop parameter boundaries.

Therefore, it is desirable to improve the performance of DLLs by reducing the delays caused by shifting beyond the minimum and maximum tap settings of the DLL delay line. It is further desirable to compensate for signal timing changes caused by changes in temperature, voltage and noise levels which may result in the DLL delay line attempting to shift beyond its minimum and maximum boundaries.

SUMMARY OF THE INVENTION

The present invention provides a unique method and circuitry for alleviating many of the problems associated with conventional DLLs by providing a buffer region near the minimum or maximum boundaries, or both, of a DLL delay line in which a DLL is not permitted to lock during initialization. In this way, delays due to signal timing shifts from temperature, voltage and noise changes in the system subsequent to initialization will be significantly less likely to force the signal timing beyond the actual delay line boundary.

According to an embodiment of the invention, rather than allowing the DLL to lock on any point on the delay line during initialization or reset, the DLL is configured to preclude one or more tap settings near the minimum or maximum delay line tap settings, or both, as possibilities for locking. When powering-up or resetting the DLL, the DLL circuit is precluded from locking to the first few or the last few delays in the adjustable delay line. If the desired lock point is inside this range, the DLL is forced to lock to the next valid clock cycle. Once the power-up/reset is complete, there will be a buffer of delay elements between the lock point and the boundaries of the adjustable delay line. This buffer of delay elements provides the DLL with room to shift in response to temperature and voltage changes, and noise induced by the operation of the part, while avoiding the DLL reset that occurs at either end of the adjustable delay line. During operation of the DLL other than initialization, the previously precluded tap settings at either end of the delay line are available for use if necessary.

A method of initializing a delay locked loop is disclosed wherein the delay locked loop is precluded from locking into at least one tap setting on a delay line during initialization, but permitted to shift to the delay element associated with that tap setting at times other than initialization. In one embodiment, the tap setting is adjacent the minimum delay boundary of the delay line. In another embodiment, the tap setting is adjacent the maximum delay boundary of the delay line. In yet another embodiment, the at least one tap setting is adjacent both the minimum and maximum delay boundaries of the delay line. The at least one tap setting may include multiple tap settings adjacent either or both of the delay boundaries.

An electronic system is disclosed comprising a processor, a memory device, an input, an output and a storage device, one or more of which include at least one delay locked loop configured to preclude one or more tap settings during initialization. A semiconductor wafer is disclosed having fabricated thereon at least one delay locked loop configured according to one or more embodiments of the invention.

BRIEF DESCRIPTION OF THE SEVERAL VIEWS OF THE DRAWINGS

The nature of the present invention, as well as other embodiments of the present invention, may be more clearly understood by reference to the following detailed description of the invention, to the appended claims, and to several drawings herein, wherein:

DETAILED DESCRIPTION OF THE INVENTION

Figure 1:
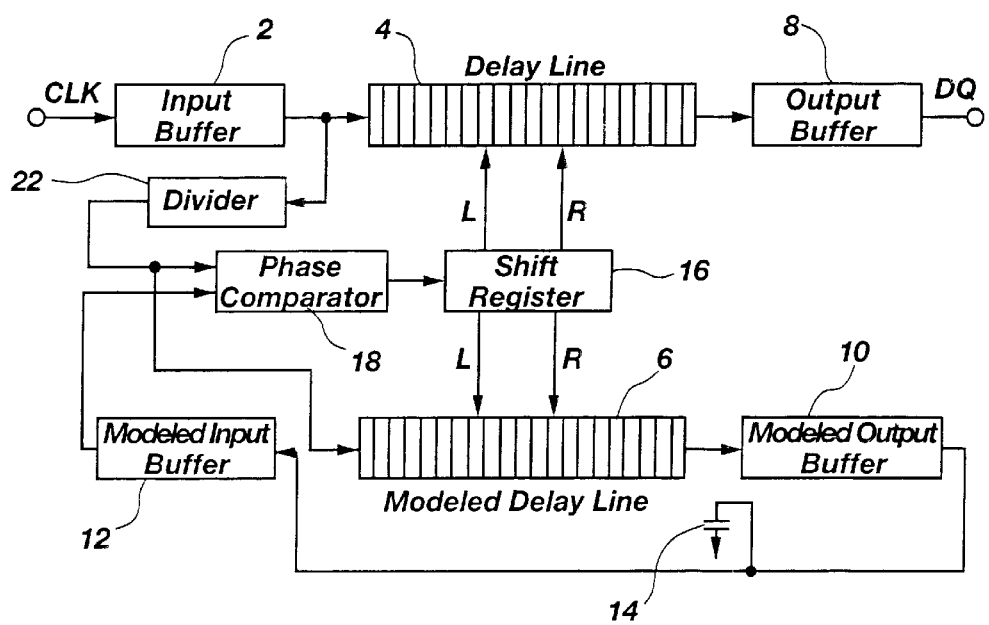
FIG. 1 is a block diagram of a prior art digital delay locked loop circuit.
Figure 2:
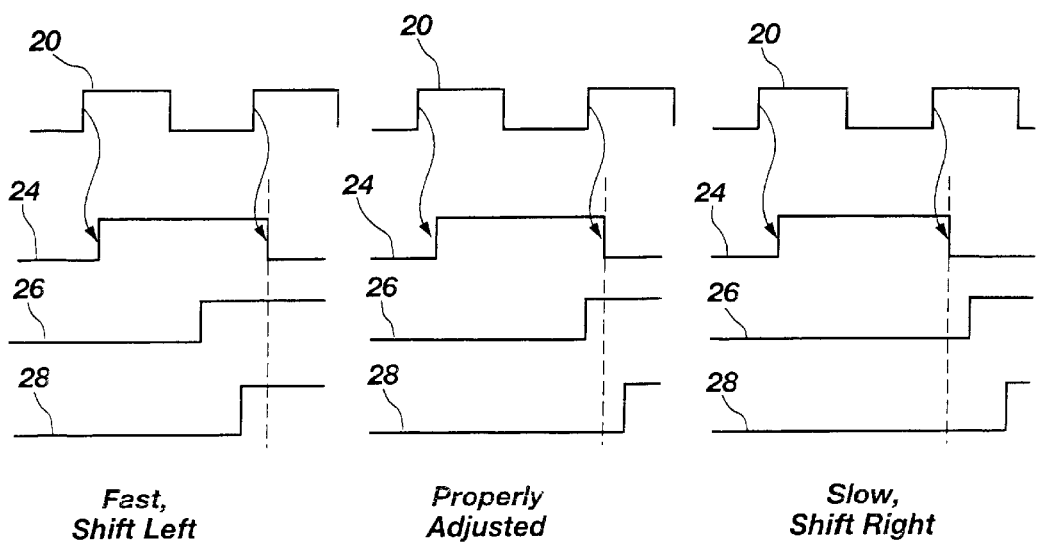
FIG. 2 is a timing diagram of a prior art delay locked loop timing adjustment.
Figure 3:
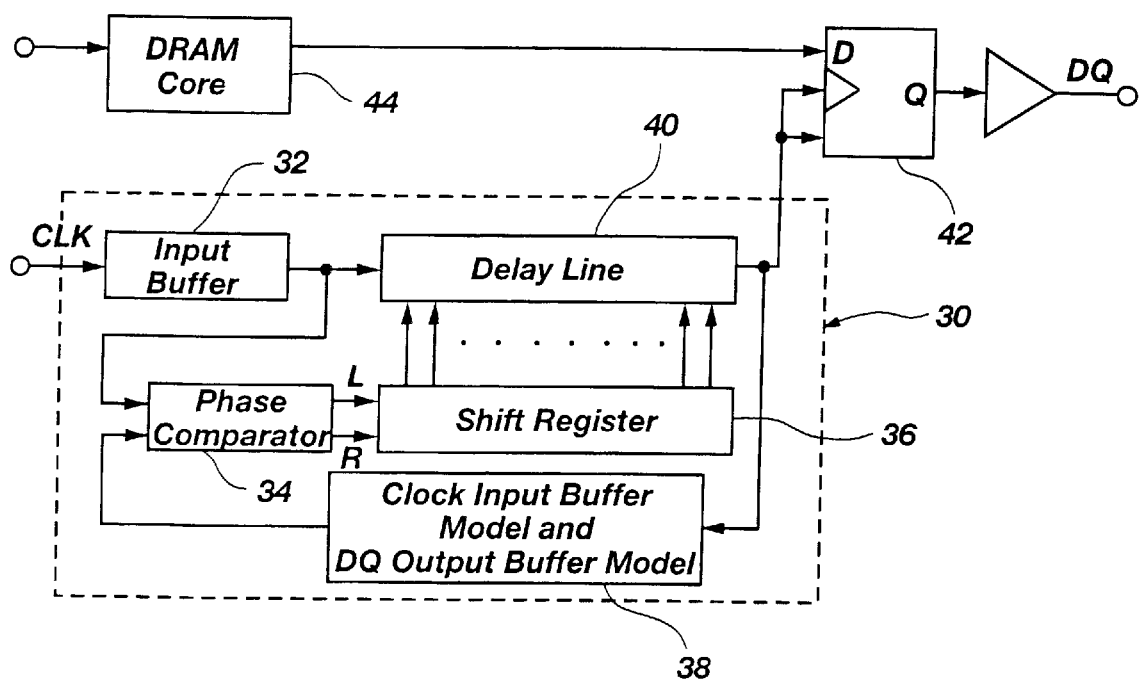
FIG. 3 is a block diagram of a delay locked loop circuit of a dynamic random access memory system according to an embodiment of the present invention.

FIG. 3 shows a diagram illustrating a delay locked loop circuit 30 for use in a memory system such as a dynamic random access memory (DRAM) system. To synchronize the system clock signal and data transfer with local circuitry, the delay locked loop circuit 30 includes an input buffer 32, a phase comparator 34, a shift register 36, a clock input buffer model and DQ output buffer model 38, and a delay line 40. Based upon a delayed clock signal output from the delay line 40, a control device 42, such as a gate, controls data transfer from the DRAM core 44 to data circuitry DQ. There are many forms of delay locked loops (DLLs) well known in the art, any of which may be adapted to function with the present invention. One of ordinary skill in the art will understand how to adapt existing DLLs in accordance with the principles of this invention from the disclosure herein.

Figure 4:
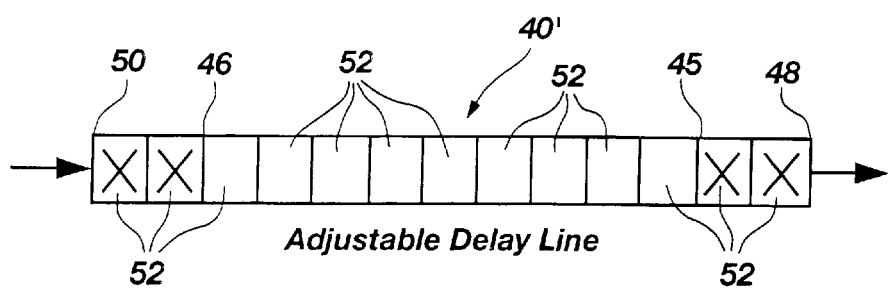
FIG. 4 is a diagram illustrating an adjustable delay line according to an embodiment of the present invention.

FIG. 4 illustrates the delay line 40' of a DLL circuit such as that shown in FIG. 3, the delay line including a plurality of delay elements 52. According to an embodiment of the present invention, artificial minimum 45 and maximum 46 boundaries are imposed upon the delay line 40 during initialization of the DLL circuit. As used herein, initialization of a DLL circuit includes both when the power is initially provided to the circuit, also called power-up, and when the circuit is reset. The artificial minimum 45 and maximum 46 boundaries imposed on the delay line 40 of the DLL circuit are distinct from the actual minimum 48 and maximum 50 boundaries of the delay line 40.

In a conventional DLL circuit, during initialization, the DLL can select any delay element 52 along the delay line 40 upon which to lock for operation of the DLL circuit apart from initialization. Each delay element along the delay line 40 from the minimum delay boundary 48 to the maximum delay boundary 50 provides delay to a signal transmitted through the delay line 40. If the DLL circuit locks on a delay element 52 setting closer to the maximum delay boundary 50, the signal will be delayed more than if the DLL circuit locks on a delay element 52 closer to the minimum delay boundary 48. The minimum 48 and maximum 50 delay boundaries are determined by the parameters of the DLL circuit. For example, a DLL circuit may have the parameters of a minimum delay boundary 48 of 4.5 to 5 nanoseconds and a maximum delay boundary 50 of 15 nanoseconds. Each delay element may provide, for example, 150 picoseconds of additional delay. As will be clear to one of ordinary skill in the art, DLL circuits with parameters defined by other delay boundaries and elements are also available. If there are more delay elements 52 available in the delay line 40, there is a wider range of adjustments which may be made to coordinate the signal timings. Ideally, an infinitely long delay line 40 is desired. However, each delay element 52 uses space on a substrate and, therefore, must be limited. For many applications, the delay line 40 is long enough that the maximum delay boundary 50 is practically irrelevant. Where the maximum delay boundary 50 becomes significant is in situations where the logic is slower than the clock frequency requiring the DLL circuit to lock on the second clock cycle rather than the first clock cycle. In these situations, a delay line 40 with sufficient delay elements 52 for at least two full clock cycles is necessary to properly lock in the second clock cycle.

For the present embodiment, as shown in FIG. 4, one or more delay elements 52 near either the minimum 48 or maximum 50 delay boundaries, or both, are indicated as being unacceptable for locking during initialization of the DLL circuit. In other words, the DLL circuit is forced to lock outside of the X'ed-out delay elements during initialization. After initialization, the DLL is permitted to shift into the X'ed-out regions if necessary. In this way, if a shift is required due to temperature or voltage changes, or due to noise from operation of any components in the system, even if the DLL circuit locked immediately adjacent to one of the artificial boundaries 45 and 46, a shift would not cause the DLL circuit to exceed the delay line parameter boundaries 48 and 50 or result in a reset of the DLL circuit. In operation during initialization, if the delay element 52 on which the DLL circuit needs to lock in the first cycle of the clock signal is beyond the minimum artificial boundary 45, the DLL circuit will be forced to lock during the second cycle of the clock signal which will result in a different delay element being selected for locking. If the delay element 52 on which the DLL circuit needs to lock is beyond the maximum artificial boundary 46, the DLL circuit will be forced to reattempt to lock during an earlier cycle of the clock signal.

Figure 5:
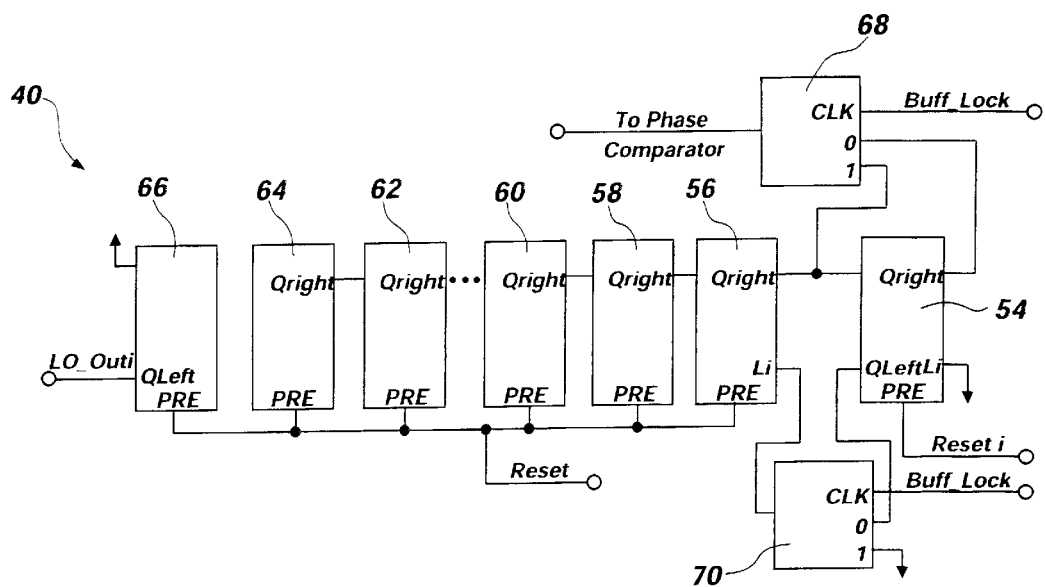
FIG. 5 is a diagram illustrating the delay elements and associated circuitry of an adjustable delay line according to a particular embodiment of the present invention.

FIG. 5 shows a diagram of one embodiment through which the advantages of the present invention may be accomplished. FIG. 5 illustrates a delay line having a plurality of delay elements 54, 56, 58, 60, 62, 64 and 66 configured to delay a signal for a predetermined duration in response to an input. One or more of the delay elements 54 is further configured such that the one or more delay elements 54 are not recognized as potential delay elements on which the DLL circuit may lock during initialization. By providing multiplexers 68 and 70 clocked by a Buff_Lock signal between the first 54 and second 56 delay elements, the second delay element 56 appears to the DLL circuit to be the first delay element in the delay line. Clock cycle times requiring settings faster than that provided by the second delay element 56 will be forced to lock using the second cycle of the clock. Though not implemented in this embodiment, a similar multiplexing scheme may be implemented in other embodiments for the maximum delay end of the delay line. As mentioned previously, however, for some applications, the maximum delay boundary is irrelevant to initialization settings because the delay line is of sufficient length that the DLL circuit will never need to lock at the maximum delay setting on the delay line.

Figure 6:
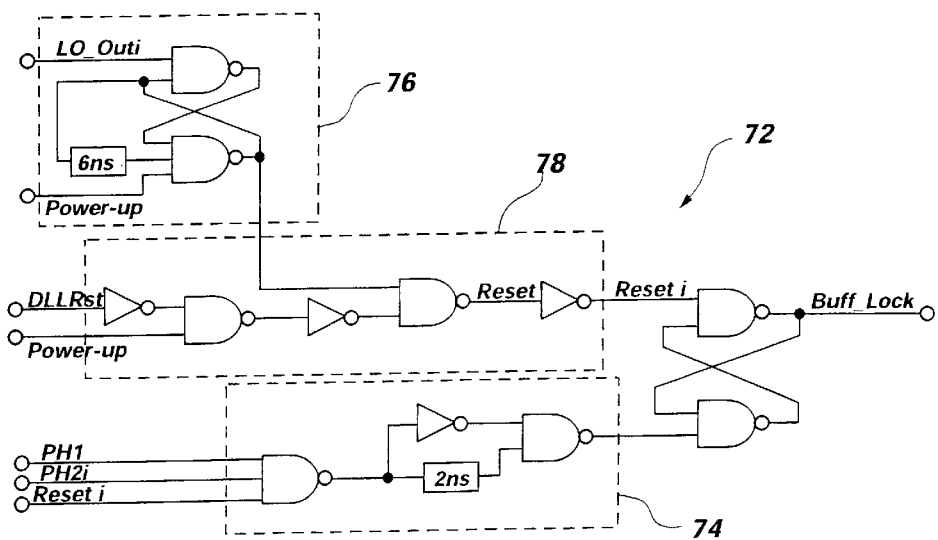
FIG. 6 is a circuit diagram of a control for a delay buffer for use with a delay line according to an embodiment of the present invention.

FIG. 6 shows a circuit diagram of one embodiment of a circuit 72 for generating the Buff_Lock signal used by the circuit of FIG. 5. When the PH1 and PH2i signals are both high, the phases of the signals compared by the phase comparator 34 (FIG. 3) are substantially equal. In response to the phases being substantially equal, a first portion 74 of the circuit 72 generates a reset pulse wherein the Buff_Lock signal goes low. This low Buff_Lock signal results in the multiplexers 68 and 70, shown in FIG. 5, causing the delay element 54 adjacent the delay line boundary to appear to be the first segment in the line. In this way, during initialization, an artificial boundary is formed such that the delay element 54 adjacent the delay line boundary cannot be selected as a locking possibility, yet once phase lock is achieved, that same delay element 54 is available to shift into if needed. Thus, at initialization, the lock point on the delay line is thus guaranteed to have a buffer region between the lock point and the actual delay line boundary. Other portions of the circuit shown in FIG. 6 assist in ensuring the DLL resets to a known state if the delay line shifts beyond the maximum boundary (circuit portion 76) and in generating the Buff_Lock signal at the appropriate initialization time (circuit portion 78).

It is also significant to note that the polarity of the reset pulse for the delay element 54 separated from the remaining delay elements 56, 58, 60, 62, 64 and 66 by the multiplexers 68 and 70 is opposite that of the remaining delay elements 56, 58, 60, 62, 64 and 66. This resets the shift bit of the separated delay element 54 to 1 while the remaining delay elements 56, 58, 60, 62, 64 and 66 are reset to 0. The 0 to 1 interface in the shift register marks the starting point for the lock sequence. As will be clear to one of ordinary skill in the art, the separated delay element 54 may be one or more delay elements depending on the application and the anticipated shift needed after initialization in a particular system. If it is anticipated that in a particular application, due to extreme temperature and voltage changes or operational noise, the signal timings will have drastic changes subsequent to initialization, several delay elements may be provided as a buffer. If it is anticipated that the signal timing changes will be minimal, only a single delay element may be needed.

Figure 7:
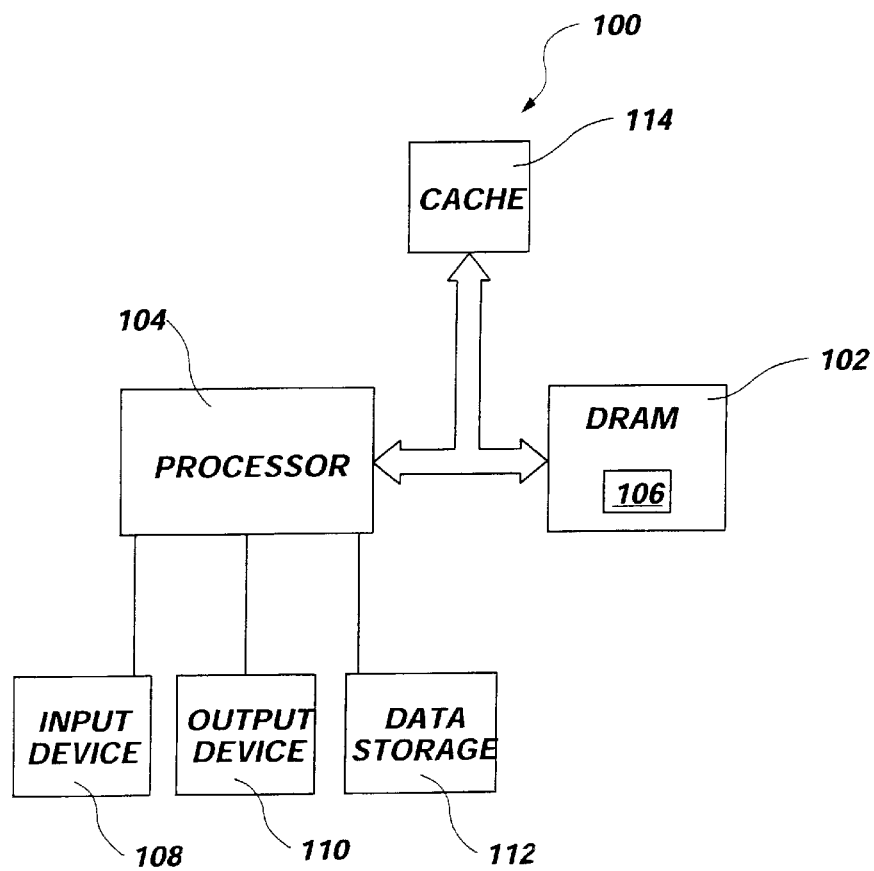
FIG. 7 is a block diagram of an electronic system including one or more components and at least one delay locked loop according to one or more embodiments of the present invention.

FIG. 7 is a block diagram of an electronic system 100 which includes components having one or more DLLs 106 configured according to one or more embodiments of the present invention. The electronic system 100 includes a processor 104 for performing various computing functions, such as executing specific software to perform specific calculations or tasks. Additionally, the electronic system 100 includes one or more input devices 108, such as a keyboard or a mouse, coupled to the processor 104 to allow an operator to interface with the electronic system 100. The electronic system 100 also includes one or more output devices 110 coupled to the processor 104, such output devices including a printer, a video terminal or a network connection. One or more data storage devices 112 are also conventionally coupled to the processor 104 to store or retrieve data from external storage media (not shown). Examples of conventional storage devices 112 include hard and floppy disks, tape cassettes, and compact disks. The processor 104 is also conventionally coupled to a cache memory 114, which is usually static random access memory ("SRAM"), and to DRAM 102. It will be understood, however, that the DLL 106 configured according to one or more of the embodiments of the present invention may be incorporated into any one of the cache, DRAM, input, output, storage and processor devices 114, 102, 108, 110, 112, and 104.

Figure 8:
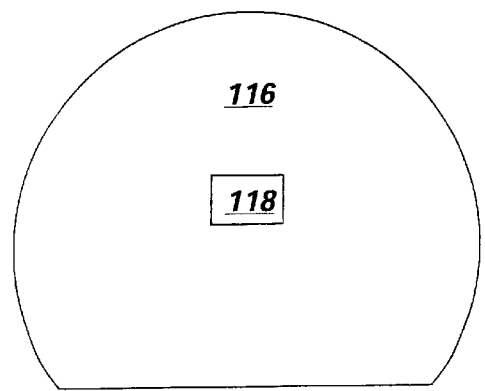
FIG. 8 is a diagram of a semiconductor wafer having at least one delay locked loop configured according to one or more embodiments of the present invention.

As shown in FIG. 8, a DLL 118 configured according to one or more embodiments of the present invention may be fabricated on the surface of a semiconductor wafer 116 of silicon, gallium arsenide, or indium phosphide in accordance with one or more embodiments of the present invention. One of ordinary skill in the art will understand how to adapt such designs for a specific chip architecture or semiconductor fabrication process. Of course, it should be understood that the DLL 118 may be fabricated on semiconductor substrates other than a wafer, such as a Silicon-on-Insulator (SOI) substrate, a Silicon-on-Glass (SOG) substrate, a Silicon-on-Sapphire (SOS) substrate, or other semiconductor material layers on supporting substrates, and that the term "wafer" as employed herein, is specifically intended to encompass such other substrates.

Although the present invention has been shown and described with reference to particular preferred embodiments, various additions, deletions and modifications that are obvious to a person skilled in the art to which the invention pertains, even if not shown or specifically described herein, are deemed to lie within the scope of the invention as encompassed by the following claims.

What is claimed is:

1. A delay line of a delay locked loop, the delay line comprising:
   a plurality of directly coupled delay elements;
   a minimum delay boundary adjacent a first delay element of the plurality of delay elements and a maximum delay boundary adjacent a second delay element of the plurality of delay elements;
   at least one delay element adjacent to the minimum delay boundary and operably coupled to the plurality of delay elements through at least one multiplexer; and
   at least one other delay element adjacent to the maximum delay boundary and operably coupled to the plurality of delay elements through at least one other multiplexer.

2. A delay line of a delay locked loop, the delay line comprising:
   a plurality of directly coupled delay elements;
   a minimum delay boundary adjacent to a first end of the delay line and a maximum delay boundary adjacent to a second end of the delay line; and
   at least one delay element adjacent to the maximum delay boundary and operably coupled to the plurality of delay elements through at least one multiplexer.

3. A delay line of a delay locked loop, the delay line comprising:
   a plurality of directly coupled delay elements; and
   at least one delay element operably coupled to the plurality of delay elements through at least one multiplexer, wherein the at least one multiplexer is configured to generate at least one artificial boundary within the delay line to preclude delay locked loop circuitry associated with the delay line from locking on the at least one delay element beyond the at least one artificial boundary.

4. The delay line of claim 3, wherein the at least one multiplexer is configured to generate the at least one artificial boundary only during initialization of the delay locked loop circuitry.

5. A delay locked loop comprising:
   a plurality of directly coupled delay elements having a maximum delay element and a minimum delay element at each end;
   first circuitry configured to select at least one delay element from among any of the plurality of delay elements; and
   second circuitry configured to preclude the first circuitry from selecting at least one of the maximum delay element and the minimum delay element from among the plurality of delay elements.

6. The delay locked loop of claim 5, wherein the second circuitry comprises circuitry configured to preclude the first circuitry from selecting the at least one of the maximum delay element and the minimum delay element during initialization.

7. The delay locked loop of claim 5, wherein the first circuitry comprises a shift register.

8. A delay locked loop comprising:
   a plurality of directly coupled delay elements;
   first circuitry configured to select at least one delay element from among the plurality of delay elements; and
   second circuitry configured to preclude the first circuitry from selecting at least one other delay element operably coupled to the plurality of delay elements, wherein the second circuitry comprises at least one multiplexer responsive to at least one control signal.

9. A delay locked loop comprising:
   a plurality of directly coupled delay elements;
   first circuitry configured to select at least one delay element from among the plurality of delay elements; and
   second circuitry configured to preclude the first circuitry from selecting at least one other delay element operably coupled to the plurality of delay elements, wherein the second circuitry is further configured to allow the at least one other delay element to be selected in response to an indication from phase comparator circuitry associated with the second circuitry that a delay signal is substantially in phase with a reference signal.

10. An electronic circuit including at least one delay line of a delay locked loop comprising:
    a plurality of directly coupled delay elements;
    a minimum delay boundary adjacent a first delay element of the plurality of delay elements and a maximum delay boundary adjacent a second delay element of the plurality of delay elements;
    at least one delay element adjacent to the minimum delay boundary and operably coupled to the plurality of delay elements through at least one multiplexer; and
    at least one other delay element adjacent to the maximum delay boundary and operably coupled to the plurality of delay elements through at least one other multiplexer.

11. An electronic circuit including at least one delay line of a delay locked loop comprising:
    a plurality of directly coupled delay elements;
    a minimum delay boundary adjacent to a first end of the at least one delay line and a maximum delay boundary adjacent to a second end of the at least one delay line; and
    at least one delay element adjacent to the maximum delay boundary and operably coupled to the plurality of delay elements through at least one multiplexer.

12. An electronic circuit including at least one delay line of a delay locked loop comprising:

a plurality of directly coupled delay elements; and at least one delay element operably coupled to the plurality of delay elements through at least one multiplexer, wherein the at least one multiplexer is configured to generate at least one artificial boundary within the at least one delay line to preclude delay locked loop circuitry associated with the at least one delay line from locking on the at least one delay element beyond the at least one artificial boundary.

13. The electronic circuit of claim 12, wherein the at least one multiplexer is configured to generate the at least one artificial boundary only during initialization of the delay locked loop circuitry.

14. An electronic system comprising:

a processor; and at least one of an input device, an output device and a data storage device associated with the processor;

wherein at least one component of the electronic system comprises:

a plurality of delay elements directly coupled as a delay line of a delay locked loop, the plurality of delay elements having a maximum delay element and a minimum delay element at each end;

first circuitry configured to select at least one delay element from among any of the plurality of delay elements; and second circuitry configured to preclude the first circuitry from selecting at least one of the maximum delay element and the minimum delay element from among the plurality of delay elements.

15. The electronic system of claim 14, wherein the second circuitry comprises circuitry configured to preclude the first circuitry from selecting the at least one of the maximum delay element and the minimum delay element during initialization.

16. The electronic system of claim 14, wherein the first circuitry comprises a shift register.

17. An electronic system comprising:

a processor; and at least one of an input device, an output device and a data storage device associated with the processor;

wherein at least one component of the electronic system comprises:

a plurality of delay elements directly coupled as a delay line of a delay locked loop;

first circuitry configured to select at least one delay element from among the plurality of delay elements; and second circuitry configured to preclude the first circuitry from selecting at least one other delay element operably coupled to the plurality of delay elements, wherein the second circuitry comprises at least one multiplexer responsive to at least one control signal.

18. An electronic system comprising:

a processor; and at least one of an input device, an output device and a data storage device associated with the processor;

wherein at least one component of the electronic system comprises:

a plurality of delay elements directly coupled as a delay line of a delay locked loop;

first circuitry configured to select at least one delay element from among the plurality of delay elements; and second circuitry configured to preclude the first circuitry from selecting at least one other delay element operably coupled to the plurality of delay elements, wherein the second circuitry is further configured to allow the at least one other delay element to be selected in response to an indication from phase comparator circuitry associated with the second circuitry that a delay signal is substantially in phase with a reference signal.

19. A semiconductor wafer including circuitry fabricated thereon, the circuitry comprising:

a plurality of delay elements directly coupled as a delay line of a delay locked loop;

a minimum delay boundary adjacent a first delay element of the plurality of delay elements and a maximum delay boundary adjacent a second delay element of the plurality of delay elements;

at least one delay element adjacent to the minimum delay boundary and operably coupled to the plurality of delay elements through at least one multiplexer; and at least one other delay element adjacent to the maximum delay boundary and operably coupled to the plurality of delay elements through at least one other multiplexer.

20. A semiconductor wafer including circuitry fabricated thereon, the circuitry comprising:

a plurality of delay elements directly coupled as a delay line of a delay locked loop;

at least one delay element operably coupled to the plurality of delay elements through at least one multiplexer, wherein the at least one multiplexer is configured to generate at least one artificial boundary within the delay line to preclude delay locked loop circuitry associated with the delay line from locking on the at least one delay element beyond the at least one artificial boundary.

21. The semiconductor wafer of claim 20, wherein the at least one multiplexer is configured to generate the at least one artificial boundary only during initialization of the delay locked loop circuitry.

22. A method of initializing a delay locked loop, the method comprising:

receiving an initialization signal;

establishing at least one artificial boundary on a delay line of the delay locked loop; and selecting a delay setting for the delay locked loop within the at least one artificial boundary.

23. The method of claim 22, further comprising:

receiving a phase lock signal; and removing the at least one artificial boundary.

24. The method of claim 22, wherein establishing the at least one artificial boundary comprises causing a delay element which is not adjacent to an end of the delay line to appear as though it is adjacent to the end of the delay line.

25. A method of synchronizing the phases of a delayed signal and a reference signal, the method including initializing a delay locked loop, the initialization comprising:

establishing at least one buffer region on a delay line of the delay locked loop; and selecting a delay setting along the delay line outside the at least one buffer region.

26. The method of claim 25, further comprising removing the at least one buffer region.

27. The method of claim 26, wherein the at least one buffer region is removed upon completion of the initialization.

28. The method of claim 25, further comprising shifting into the at least one buffer region to adjust for a signal timing change resulting from at least one of a temperature change, a signal voltage change and a signal noise change.

29. The method of claim 25, wherein the delay locked loop comprises a plurality of delay elements including a first portion forming the at least one buffer region and a second portion forming a remainder of the plurality of delay elements, the method further comprising:
   resetting the first portion of the plurality of delay elements to a value of 1; and
   resetting the second portion of the plurality of delay elements to a value of 0.

* * * * *